(12) United States Patent
Voisine

(10) Patent No.: US 8,754,630 B2
(45) Date of Patent: Jun. 17, 2014

(54) APPARATUS AND METHOD FOR MEASURING REAL TIME CLOCK ACCURACY IN AN ELECTRIC METER

(75) Inventor: John T. Voisine, Lafayette, IN (US)

(73) Assignee: Lanids+Gyr, Inc., Lafayette, IN (US)

( * ) Notice: Subject to any disclaimer, the term of this patent is extended or adjusted under 35 U.S.C. 154(b) by 690 days.

(21) Appl. No.: 12/777,244

(22) Filed: May 10, 2010

(65) Prior Publication Data

US 2010/0283452 A1    Nov. 11, 2010

Related U.S. Application Data

(60) Provisional application No. 61/176,629, filed on May 8, 2009.

(51) Int. Cl.
*G01R 11/32*    (2006.01)

(52) U.S. Cl.
USPC ............................................. 324/74; 324/96

(58) Field of Classification Search
USPC ............................................. 324/96, 74, 75
See application file for complete search history.

(56) References Cited

U.S. PATENT DOCUMENTS

| | | | |
|---|---|---|---|
| 4,352,104 A * | 9/1982 | Mizuta et al. | 340/870.02 |
| 6,633,825 B2 * | 10/2003 | Burns et al. | 702/61 |
| 6,707,287 B2 * | 3/2004 | Takeda et al. | 324/127 |
| 6,927,640 B2 | 8/2005 | Gomez | |
| 7,167,804 B2 * | 1/2007 | Fridholm et al. | 702/62 |
| 2001/0040833 A1 * | 11/2001 | Bogin et al. | 365/222 |

* cited by examiner

*Primary Examiner* — Arleen M Vazquez
*Assistant Examiner* — Feba Pothen
(74) *Attorney, Agent, or Firm* — Maginot, Moore & Beck LLP

(57) ABSTRACT

An arrangement for measuring an internal clock within an electricity meter includes an optical communication circuit within the meter, an optical detector external to the meter, and a frequency counter. The optical communication circuit within the electricity meter is operably coupled to receive a pulse output of the meter's internal clock, and is further configured to generate a corresponding optical pulse representative of the pulse output. The optical detector is configured to detect the pulse output via an optical port of the electricity meter. The frequency counter is operably coupled to receive from the optical detector a signal that is representative of the detected pulse output.

12 Claims, 5 Drawing Sheets

US 8,754,630 B2

APPARATUS AND METHOD FOR MEASURING REAL TIME CLOCK ACCURACY IN AN ELECTRIC METER

This application claims the benefit of U.S. Provisional Patent Application Ser. No. 61/176,629, filed May 8, 2009, which is incorporated herein by reference.

FIELD OF THE INVENTION

The present invention relates to utility meters having processors that employ or rely upon clock circuits.

BACKGROUND

Electricity meters sometimes incorporate timing functions for billing metrics. For example, timing functionality is useful in "time-of-use" metering where the rate for energy can change depending on the time of day the energy is used. Meters employing time-of-use ("TOU") metering employ a real time clock that is often based on a precision timing crystal. Such meters are typically required to maintain the real time clock through a power outage so that the billing schedule may resume in a proper state once power is restored.

The real time clock function can be maintained through a power outage using an auxiliary power source such as a battery. Power outages, however, can create issues with real-time clock accuracy. In particular, when utility power is available in the meter (i.e. the normal case), the real-time clock can self-calibrate or self-adjust based on the power line signal, which is typically an accurate, 60 Hz signal. During a power outage, however, the precision source is not available and drift of the free-running real time clock is possible. Moreover, in some international markets, the power line signal may not have a reliable and precise frequency.

There are industry standards for accuracy of the real time clock in utility meters. In particular, ANSI C12.1 2001 requirements for real time clock accuracy are two (2) minutes per week or 200 ppm over a temperature range of 30° C. to 70° C. Some utilities require greater accuracies such as 1 minute per month or 23 ppm at temperatures of 30° C. and 40° C. It is sometimes necessary to verify that the real-time clock is operating within the defined parameters to ensure compliance with the relevant standard.

Traditional methods of verifying clock accuracy are not always convenient as standards for clock accuracy become more restrictive. For example, prior methods tended to work fine when accuracy requirements were broad such as 200 ppm. However, verifying clock accuracy when limits are in the range of 23 ppm resulted in lengthy measurement times or complicated test setups that were not very practical in verifying accuracy on large numbers of meters. For example if a meter's clock can only be read to a resolution of 1 second and it is desired to determine accuracy to a resolution of 1 ppm, then the measurement time required would be 1,000,000 seconds or 11.57 days.

It is also desirable to verify clock accuracy without removing the meter cover or breaking the meter cover seal if one is used. Consequently, a nonintrusive method of quickly verifying timing accuracy is desirable. If a method of measuring clock accuracy is sufficiently brief, it may be practical to calibrate the meter's real-time clock during production or manufacturing. Currently, the energy measurement function of the meter can be calibrated during manufacturing.

There is a need, therefore, for a method and/or apparatus that provides a more time-efficient clock measurement. There is also a need for such a method that can be carried out without removing the meter cover.

SUMMARY

At least some embodiments of the present invention address the above-referenced issues by determining clock accuracy using the optical communication port of the meter.

One embodiment is an arrangement for measuring an internal clock within an electricity meter that includes an optical communication circuit within the meter, an optical detector external to the meter, and a frequency counter. The optical communication circuit within the electricity meter is operably coupled to receive a pulse output of the meter's internal clock, and is further configured to generate a corresponding optical pulse representative of the pulse output. The optical detector is configured to detect the pulse output via an optical port of the electricity meter. The frequency counter is operably coupled to receive from the optical detector a signal that is representative of the detected pulse output.

Another embodiment of the invention is an arrangement within a utility meter that includes an optical communication circuit and a processing circuit, both disposed within the meter housing. The processing circuit is operably coupled to selectively provide a clock output and a metrology circuit output to the optical communication circuit. In this case, the metrology circuit output is an output from a processing circuit from the meter.

The above-described features and advantages, as well as others, will become more readily apparent to those of ordinary skill in the art by reference to the following detailed description and accompanying drawings.

DETAILED DESCRIPTION

Figure 1:
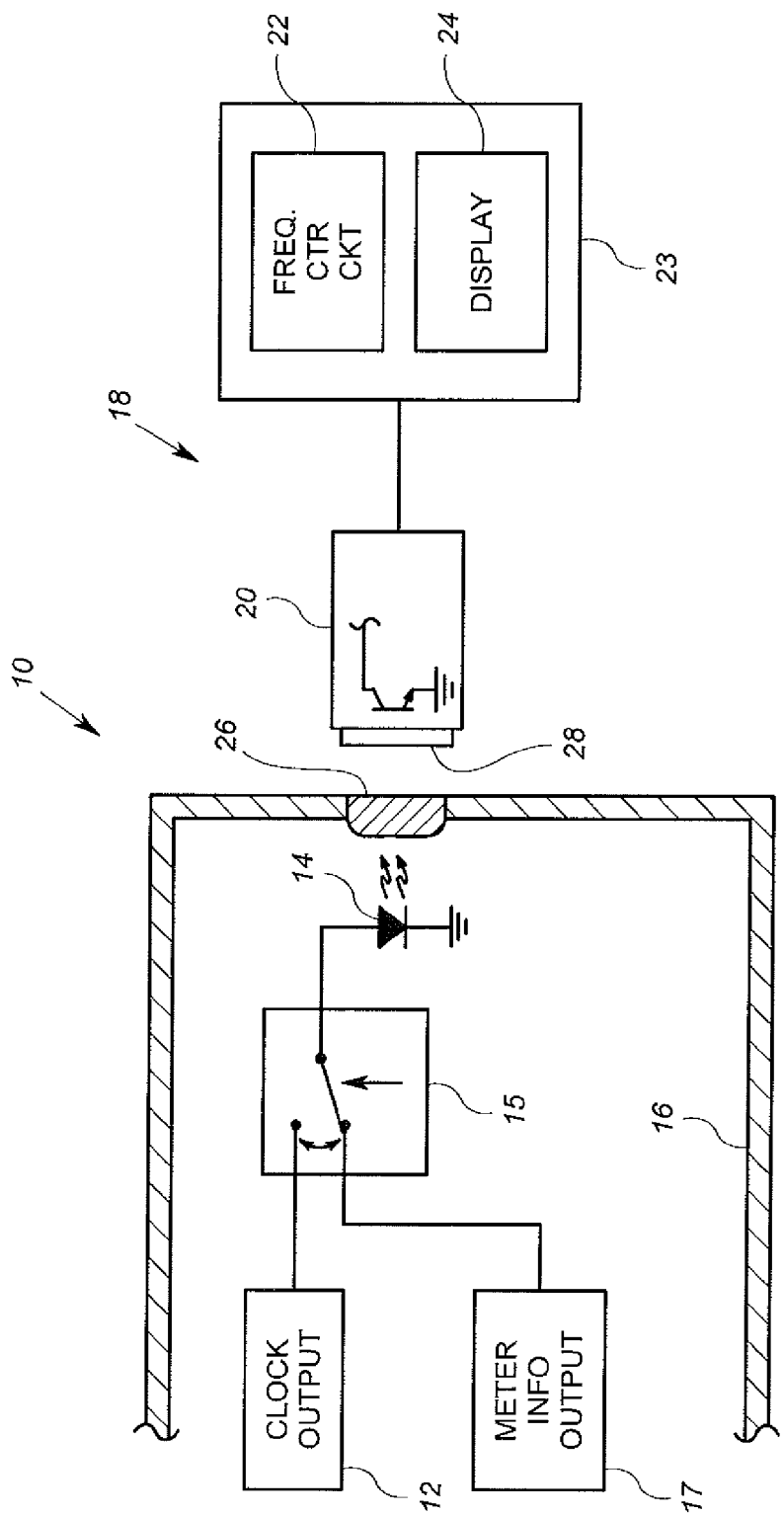
FIG. 1 is a schematic diagram of an arrangement according to a first exemplary embodiment of the invention.

FIG. 1 shows an exemplary embodiment of an arrangement 10 for determining the real-time clock accuracy in an electric utility meter. The arrangement 10 includes an optical communication circuit 14 disposed within a utility meter housing 16. The arrangement 10 also includes a processing circuit 15 disposed within the utility meter housing 16. The processing circuit 15 is operably coupled to operably connect or provide signals from a clock output 12 and a metrology circuit output 17 to the optical communication circuit 14.

The arrangement 10 in this embodiment also includes a test device 18. The test device 18 includes an optical communication circuit 20, a frequency counter circuit 22, and a display 24. The optical communication circuit 20 may be an optical probe that is electrically coupled to a self-contained frequency counter unit 23 that includes the frequency counter circuit 22 and the display 24. Such self-contained frequency counter units are known in the art.

The clock output 12 is operably coupled to a device or circuit, not shown in FIG. 1, that develops and maintains real-time clock information within an electricity meter. Real-time clocks are known, and are known to provide clock (e.g. day-time) information to metering circuitry, also not shown in FIG. 1, for time-of-use metering and other functions. In FIG. 1, the clock output 12 provides pulses that are generated based on the time-keeping function of the real-time clock. In some cases, the time-keeping function of a meter does not necessarily require or employ a real-time clock. For example, if the meter is a demand-only type of meter, i.e. a meter that tracks highest periods of demand, and not a time of use type of meter, the timing function will be required to have sufficient interval timing accuracy but not necessarily "time of day" accuracy.

In any event, the clock output 12 is configured to provide a pulse representative of the time-base of the real-time clock and other clocking functions. For example, the pulse output 12$a$ may include a direct output from a crystal oscillator, such as a nominally 32,768 Hz oscillator. Alternatively, the output may be a pulse otherwise generated on a periodic basis, such as a pulse generated at a fraction of the nominal oscillator frequency. In another alternative, a pulse representative of a one-second time period (or longer) may be provided at the output 12. In the latter case, the pulse representative of one second may also be an adjusted or calibrated output of the real-time clock 12. For example, if the real-time clock is based on an oscillator of 32,768 Hz, and due to the manufacturing or other considerations, it is known that the oscillator actually operates at 32,755 Hz, then the real-time clock may be calibrated to generate a one-second pulse for every 32,755 output pulses of the oscillator. This calibrated one-second pulse may be provided at the clock output 12. In this way, the accuracy of the calibrated real-time clock can be measured. More detail on obtaining the clock output is described below in connection with FIG. 2.

The metrology circuit output 17 is an output from the electricity metering circuit, not shown, that generates energy consumption information and or meter control information. The metrology circuit output 17 may suitably be the output calculations of a processing circuit. The processing circuit may be part of the processing circuit 15. (See, e.g. FIG. 2). The metrology circuit output 17 is configured to generate signals for external communication of metering information according to a meter communication protocol. Such metering information may include digital values representative of energy consumption, meter calibration information, or other meter information. Unlike the clock output 12, the metrology circuit output 17 does not merely provide periodic clock pulses, but rather digital formatted data. In some embodiments, however, the metrology circuit output 17 may also generate pulses representative of energy consumption, wherein each pulse represents an amount of energy consumed.

The processing circuit 15 includes a switch that is configured to selectively connect either the clock output 12 or the metrology circuit output 17 to the communication circuit 14. In one embodiment, the processing circuit 15 causes the metrology circuit 17 to be connected to the communication circuit 14 absent a specific signal indicative of a request to connect the clock output 12 to the communication circuit 14. The processing circuit 15 may suitably include a transistor switch or other device that physically or logically connects either the clock output 12 or the metrology circuit output 17 to the communication circuit 14. In one embodiment such as that shown in FIG. 2, the clock output the processing circuit 15, the metrology circuit output 17 are all housed in a single integrated circuit package, not shown. In such a case, the processing circuit 15 merely implements a firmware or software switch to connect either the metrology circuit value or the clock pulse output to the output of the integrated circuit package that is connected to the communication circuit 14.

The optical communication circuit 14 includes a device, such as a photo diode, that converts electrical signals into optical signals. The optical communication circuit 14 is located within the housing 16 such that it is proximate a transparent or translucent port 26 in the housing 16. In this configuration, the optical communication circuit 14 is configured to communicate optical signals to devices external to the housing 16.

Referring now to the test device 18, the optical communication circuit 20 is a device configured to receive optical signals and convert the received signals into electrical signals. The optical communication circuit 20 may suitably comprise a phototransistor disposed proximate an optical port 28. The optical communication circuit 20 is configured to provide the electrical signals to a frequency counter circuit 22 of the test device 18. The optical communication circuit 20 is generally capable to detect pulses generated by the communication circuit 14 that have been transmitted through the meter housing 16 when the optical ports 26 and 28 are disposed adjacent to each other. For example, both of the optical communication circuits 14, 20 can include an IR optical detector and an IR optical transmitter.

The frequency counter circuit 22 is a circuit that is capable of detecting frequencies based on the period between successive pulses, and displaying them on the display 24, which is typically integrated in the same housing. Such devices are known in the art, and include the 53131A Universal Frequency Counter available from Agilent.

In ordinary operation of the meter, the test device 18 is not disposed as shown in FIG. 1. In most cases, nothing is connected to the optical port 26 of the meter. However, from time to time, it may be desirable for a technician to communicate data to or from the meter via the optical port 26. To this end, it is known for the metrology circuit to communicate data with an external device, not shown, via the optical port 26. This external device can be a portable computer or handheld computer, sometimes referred to as a meter programming unit, that can be used to extract metering data from the metrology circuit. In the embodiment of FIG. 1, this external device or meter programming unit would include an optical probe that is disposed adjacent to the optical port 26, similar to the manner in which the test device 18 is connected.

To communicate such metering data, the processing circuit 15 causes the metrology circuit output 17 to be connected to the communication circuit 14. In some examples, the processing circuit 15 causes the metrology circuit output 17 to be connected to the communication circuit 14 responsive to an input requesting communications. The input requesting communications typically is received via an optical input circuit, not shown in FIG. 1, that is connected to the processing circuit 15. When the metrology circuit output 17 is connected to the communication circuit 14, the metrology circuit output 17 may communicate metering data, either in the form of formatted digital data representative of data words or bytes, or in the form of a pulse train having a frequency that is indicative of real time power consumption. Modes and types of communication of data from a metrology circuit output 17 to an external source are known in the art.

In another operation, a technician or compliance inspector may use the test device 18 to certify the accuracy of the real-time clock 12. To this end, the technician places the optical port 28 of the test device 18 adjacent to the optical port 26 on the meter housing 16 as shown in FIG. 1. The processing circuit 15 then, responsive to a suitable input via circuits not shown in FIG. 1, connects the clock output 12 to the communication circuit 14. The clock output 12 provides electrical clock pulse signals to the optical communication circuit 14. The communication circuit 14 converts the received electrical pulses to optical pulses, such as infrared signal pulses. The optical communication circuit 14 generates such pulses such that they radiate through the transparent or translucent optical port 26 of the meter housing 16.

The optical communication circuit 20 of the test device 18 receives the optical clock pulse signal and converts the optical signals to electrical clock pulse signals. The optical communication circuit 20 provides the electrical clock pulse signals to the frequency counter 22. The frequency counter 22 operates in a known manner to develop a precision frequency measurement representative of the frequency of the pulses, typically to a tolerance of 1 ppm. The frequency counter 22 provides the developed frequency measurement to the display 24, or to some other output, or to storage, not shown.

The technician may then compare the displayed frequency of the clock pulses on the test device 18 to the expected clock frequency for the meter. This comparison may be used to verify the accuracy of the clock, and/or determine whether the clock within the meter requires correction. The arrangement of FIG. 1 is thus capable of communicating clock pulses via an optical port, which allows for external verification via the use of a probe (e.g. elements 20/28) and a frequency counter device. Moreover, the arrangement of FIG. 1 employs an optical communication circuit 14 and port 26 already present in many meters.

Moreover, a typical frequency counter (e.g. counter 22) can generate an accurate frequency measurement a manner of 1 to 10 seconds. By providing a means of determining real-time clock accuracy to a resolution of 1 ppm over a relatively short period of time such as 1 second or 10 seconds, meter manufacturers as well as electric utilities can determine quickly and conveniently if a meter meets appropriate clock accuracy requirements. If pulses are generated using the meter's optical port, clock accuracy can be determined quickly without removing the meter cover. Clock accuracy could also be determined and calibrated when the meter is manufactured.

In addition to the invention described above it is possible for the printed wiring board ("PWB") assembler to measure the 32,768 Hz frequency (to a resolution of 1 ppm) directly at the time the board is assembled using a fixture such as a "bed of nails" for retrieval later in the manufacturing process or by the end user. The clock accuracy could then be stored in a data base and identified by a board assembly serial number. The clock accuracy information could also be stored in non-volatile memory on the board itself for later retrieval. However, measuring the crystal frequency directly at the time the PWB is assembled may be undesirable if the act of measuring the crystal influences the crystal frequency. Also the temperature of the PWB assembly at the time the frequency is determined may not be the desired temperature for measuring clock accuracy. Providing a means of determining clock accuracy via the optical port or option output is useful if it is desired to confirm accuracy after a meter is manufactured such as for testing at different temperatures or at a customer's test lab or in the filed at a specific site or anytime clock accuracy is questioned. Additionally, if the real time clock is derived from line frequency instead of a crystal, line frequency accuracy can be determined in a similar fashion.

Figure 2:
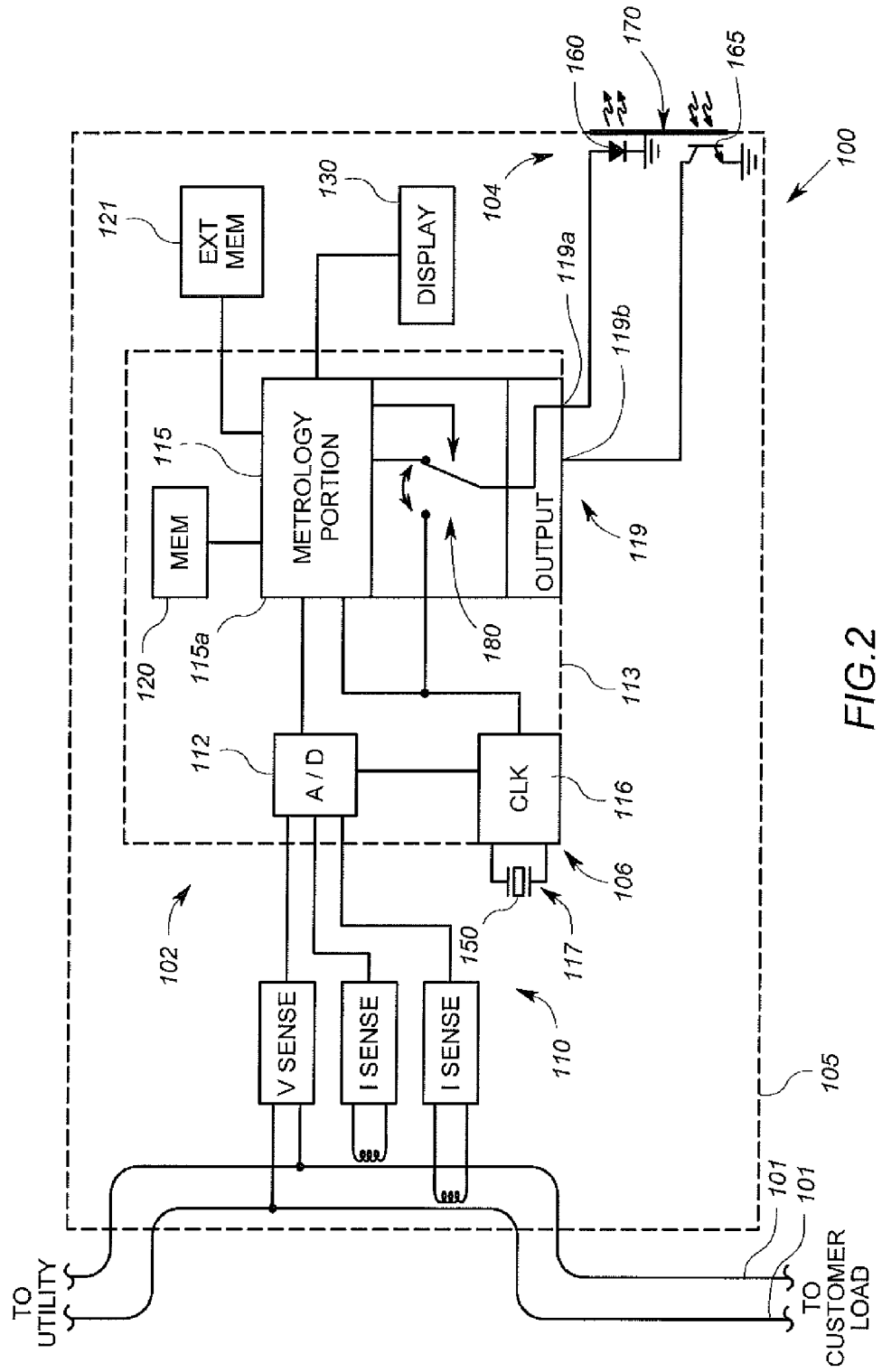
FIG. 2 is a schematic diagram of an electricity meter according to a second exemplary embodiment of the invention.

FIG. 2 shows in further detail an exemplary meter 100 according to a first embodiment of the invention. The meter 100 includes a housing 105 in which are disposed a metrology circuit 102, an optical communication circuit 104 and a clock circuit 106. The meter 100 also includes memories 120, 121 and a display 130. The metrology circuit 102 further includes a sensor circuit 110, an A/D conversion unit 112, and at least a portion 115a of a processing circuit 115. The clock circuit 106 includes elements both external to and internal to the processing circuit 115. Specifically, the clock circuit 106 includes an internal clock circuit 116 and an external clock circuit 117.

It will be appreciated that in the exemplary embodiment, the processing circuit 115 is a commercially available chip package 113 that includes the internal clock circuit 116, the A/D conversion unit 112, the memory 120, and a set of output pins 119 and which is intended to be connected to an external source of a clock reference frequency. The internal clock circuit 116 includes elements that generate the clock information used by the digital processing elements of the processing circuit 115, and for the real-time clock maintained by the processing circuit 115. The internal clock circuit 116 may include at least a portion of an oscillator circuit, including for example, a phase-locked loop and voltage controlled oscillator, not shown. The external clock circuit 117 of the clock circuit 106 includes the source of the clock reference frequency, specifically, a crystal resonator 150. Such elements are known.

Referring now to the housing 105, the housing 105 may take any suitable form, and is generally configured to withstand a wide range of environmental conditions. The housing 105 also provides at least some protection against environmental conditions to the various elements disposed therein. Suitable housings for utility meters are well-known in the art.

As discussed above, the metrology circuit 102 includes the sensor circuit 110, as well as an A/D conversion unit 112 and the processing circuit 115. The sensor circuit 110 in one embodiment includes voltage sensors and current sensors that are operably coupled to detect voltage and current signals representative of voltage and current provided to a load, and to generate measurement signals therefrom. In particular, the measurement signals generated by the sensor circuit 110 are analog signals each having a waveform representative of the voltage and current provided to the load. A suitable example of a voltage sensor includes a voltage divider that is operably coupled to the power lines. A suitable example of a current sensor includes a current transformer that is disposed in a current sensing relationship with the power line signal. These and other voltage and current sensors are known in the art.

The A/D conversion unit 112 may be any suitable analog-to-digital converter that is configured to sample the analog measurement signals generated by the sensor circuit 110. The A/D conversion unit 112 is operably coupled to provide the resulting digital measurement signals to the processing circuit 115.

The processing circuit 115 includes a metrology portion 115a that is configured to receive the digital measurement signals from the A/D conversion unit 112 and generate energy consumption data therefrom. To this end, the metrology portion 115a of the processing circuit 115 includes digital processing circuitry that processes the digitized measurement signals to thereby generate the energy consumption data. Such circuits are well known in the art. As is known in the art, the processing circuit 115 may also include the functions of a controller. To this end, the processing circuit 115 also suitably includes general control and supervisory processing circuitry, not shown in detail, but which would be known to those of ordinary skill in the art. Part of this control circuitry is a firmware switch 180, discussed further below. The processing circuit 115 communicates information with external devices with serial input and output ports connected to output pins 119 of the chip package 113, as will be discussed further below.

Accordingly, the sensor circuit 110, the A/D conversion unit 112 and processing circuit 115 form the metrology circuit 102, which is configured to generate energy consumption data representative of energy used by the load. The processing circuit 115 also performs one or more operations that rely on a real-time calendar/clock.

The memory 120 of the chip package 113 includes one or more storage devices of different types. The memory 120 may include volatile or non-volatile RAM, EEPROM, or other readable and writeable memory device, any of which may be incorporated into the integrated circuit package 113. The memory 120 stores instructions and/or parameters used by the processing circuit 115, and may further store energy consumption data. By contrast, the memory 121 is external to the chip package 113, and provides for extended data storage. Such memory 121 would also, however, be located within the housing 105.

The optical communication circuit 104 is operably coupled to the processing circuit 115 via specific pins of the output 119. The optical communication circuit 104 in this embodiment includes optical transmitter 160 and an optical receiver 165, both of which are located at a translucent or transparent optical port 170 of the meter housing 105. The optical transmitter 160 is electrically coupled to a TX pin 119*a* of the chip package output 119, and the optical receiver is 165 is electrically coupled to an RX pin 119*b* of the chip package output 119. The optical transmitter 160 and the optical receiver 165 are thus configured to communicate data and other signals between the processing circuit 115 and devices external to the meter housing 105. Such data can include energy consumption data, calibration data and the like. In accordance with some embodiments of the invention, the optical transmitter 160 is further configured to transmit clock signals optically to a device external to the meter 100. In other embodiments discussed further below, the optical receiver 165 is further configured to receive optical clock pulses from an external device for comparison to an internal clock.

The display 130 is operably coupled to the processing unit 115 and provides a visual display of information, such as information regarding the operation of the meter 100. For example, the display 130 may provide a visual display regarding the power measurement operations or energy consumption data of the meter 100.

During normal operation, the metrology circuit 102 performs operations to detect electrical signals on the power lines 101 and generating metering information therefrom. Such operations are known in the art. The internal clock circuit 116 and the external clock circuit 117 also operate to generate clock signals for the processing circuit 115 and the A/D conversion unit 112. The processing circuit 115 uses the clock signal for execution of processing operations, as well as for maintaining a real-time calendar clock. The processing circuit 115 may suitably use the real-time calendar clock to adjust utility cost rates based on time of day or time of year, as well as for other purposes.

The firmware "switch" 180 of the processing circuit 115 allows the output TX pin 119*a* to controllably and alternatively receive data and/or pulse signals from either the processing circuit 115 or the clock 116. Accordingly, the firmware switch 180 may suitably include or comprise programming that alternatively provides clock signals, which are available within the chip package, or data signals (from the metrology function of the processing circuit 115), to the TX pin 119*a*.

Figure 5A:
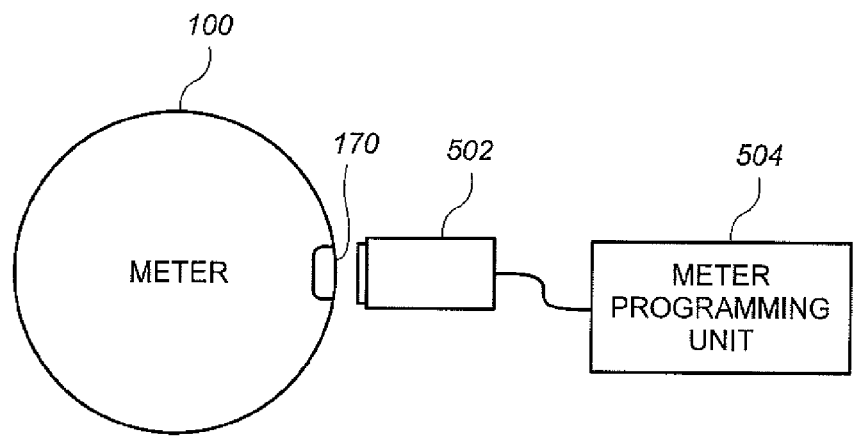
FIG. 5 show block diagrams of a meter optically connected to a meter programming unit and a frequency counter or frequency source in accordance with embodiments of the invention.

From time to time, the optical communication circuit 104 will communicate data with an external programming device, not shown, but which is known in the art, via the optical port 170. The data may suitably be metering data. For example, the optical communication circuit 104 may communicate energy consumption information, calibration data, or configuration data between the metrology circuit 102 and the external programming device. FIG. 5A, discussed further below, shows a meter 100 connected this manner to a meter programming unit 504.

To transmit data, the firmware switch 180 is arranged to communicate data from the metrology function of the processing circuit 115 to the output TX pin 119*a*. The processing circuit 115 provides such data to the output TX pin 119*a* via the firmware switch 180. The optical transmitter 160 converts the data signals to optical signals and provides the optical signals to an external device, not shown, via the optical port 170. To receive data, the optical receiver 165 receives optical signals from the external device, converts the optical signals to electrical signals, and provides the electrical signals to the processing circuit 115 via the RX port 119*b*.

Accordingly, at least some embodiments of the present invention address the above-referenced issues regarding clock accuracy by using the meter's optical communication port 170 to verify the frequency of the internal clock. Clock accuracy is determined by measuring a pulse output where the timing between pulses is derived from the meter's internal time clock. For example if the crystal oscillator 150 is a typical 32,768 Hz watch crystal, pulses could be generated directly from the meter's internal clock at a rate of 32,768 Hz. Pulses could also be generated at some fraction of the 32,768 frequency such as ½ or ¼ etc. In this embodiment, if a clock accuracy test is to be performed, the processing circuit 115 causes the firmware switch 180 to connect a clock output to the output pin TX 119*a*. The clock pulses can then propagate to the optical transmitter 160, which transmits the pulses to an external device, such as a frequency counter, not shown, having its own optical probe.

Figure 3:
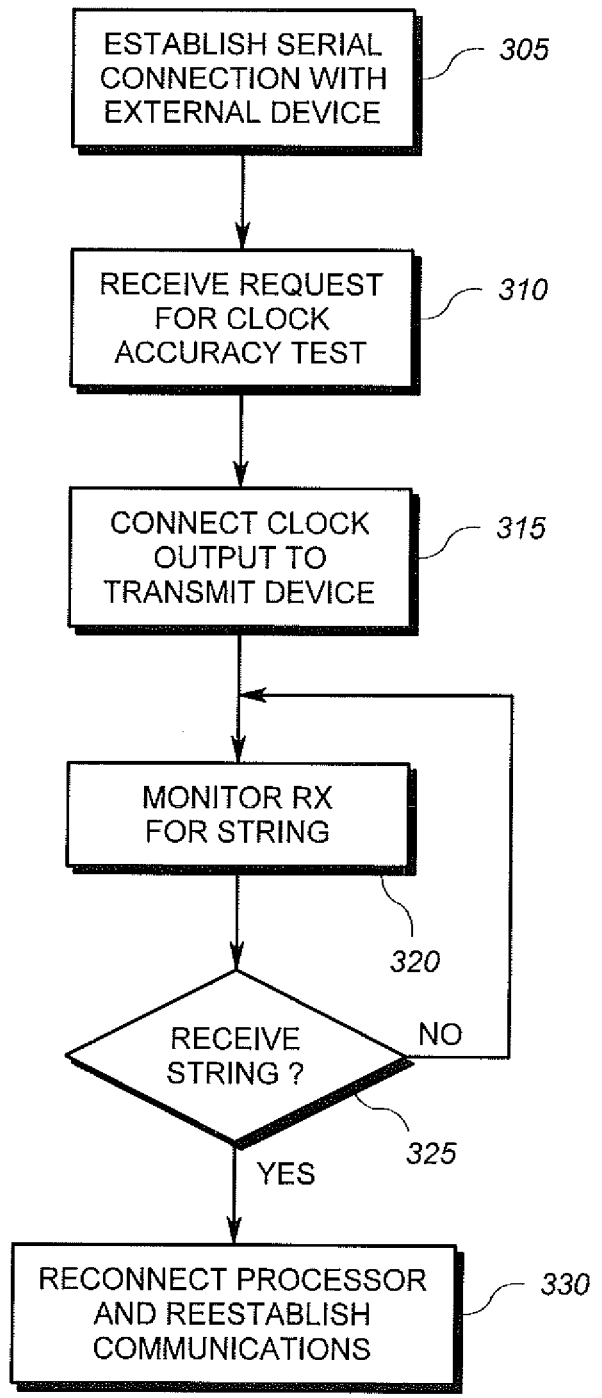
FIG. 3 is a flow diagram of a first exemplary set of operations of the processing circuit of the electricity meter of FIG. 2.

FIG. 3 shows a first set of operations that may be performed by the processing circuit 115 to perform a test of clock accuracy according to a first embodiment of the invention. The first set of operations shown in FIG. 3 involve two external devices, shown in FIGS. 5A and 5B. The two devices including a meter programming unit 504, which is known in the art, and a frequency counter unit 506 similar to the frequency counter unit 23 of FIG. 1.

Initially, the meter programming unit 504 is connected to the optical port 170. To this end, the meter programming unit 504 includes or is connected to an appropriate optical probe 502. In step 305, the processing circuit 115 establishes a serial connection with the meter programming unit 504 in any known or suitable manner. The establishment of serial connection with the meter programming unit 504 will involve bidirectional transmission of handshaking data, among other things. Protocols for communications between metrology circuits and meter programming units are known in the art. As discussed above and shown in FIG. 2, the processing circuit 115 provides data to the external meter programming unit 504 via the firmware switch 180, the TX pin 119*a* and the optical transmitter 160. As also discussed above and shown in FIG. 2, the processing circuit receives data from the external meter programming unit via the optical receiver 165 and the RX pin 119b. In this embodiment, the RX pin 119b need not be switched via the firmware switch 180.

After serial connection is established with the meter programming unit 504, the processing circuit 115 may exchange meter data with the meter programming unit 504. Such metering data can include energy consumption information, calibration data, configuration data, and programming instructions. If the technician using the meter programming unit 504 desires to test clock accuracy, the processing circuit 115 will receive from the meter programming unit 504 a digital signal representative of a request for clock accuracy. (Step 310).

Figure 5B:
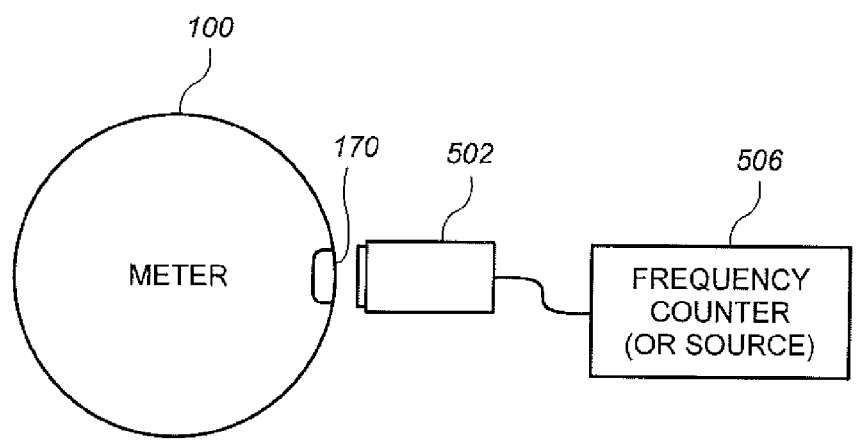

After step 310, the processing circuit proceeds to step 315. In step 315, the processing circuit 115 connects the clock output to the output TX pin 119a via the firmware switch 180. Accordingly, after step 315, the optical transmitter 160 transmits only clock pulses through the optical port 170. At that point, the technician may connect the frequency counter 506 to the optical port 170 as illustrated in FIG. 5B.

The processing circuit 115, in the meantime in step 320, monitors the RX pin 119b for a recognizable string of data. If, in step 325, the processing circuit 115 does not recognize a string of data at the RX pin 119b, the processing circuit 115 continues to produce clock signals at the output TX pin 119a. The RX pin 119b will only receive a recognizable string when the test device is removed from the optical port 170 and the meter programming unit is again coupled via the optical port 170. Thus, when the technician has received a suitable measurement, the technician may remove the test device and reconnect the meter programming unit 504 (see FIG. 5A). This allows the technician to take as much or as little time as necessary to obtain an adequate clock frequency measurement.

When the meter programming unit 504 is reconnected, it will transmit a recognizable string to the processing circuit 115 via the optical receiver 165 and RX pin 119b. In step 325, if the processing circuit 115 recognizes the string, the processing circuit 115 proceeds to step 340. In step 340, the processing circuit 115 reconnects its data output to the TX pin 119a via the firmware switch 180 to reestablish the serial communication connection with the meter programming unit 504.

Figure 4:
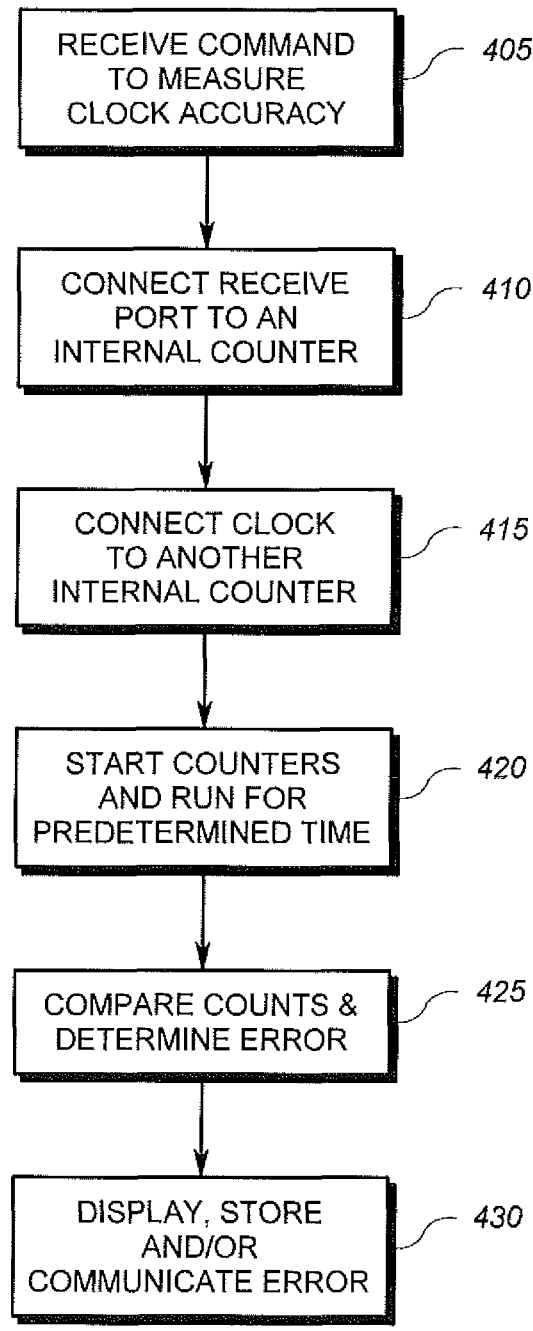
FIG. 4 is a flow diagram of a second set of operations of the processing circuit of the electricity meter of FIG. 2.

FIG. 4 shows an alternative set of operations that may be used in an alternative test configuration. In the alternative test configuration, a source of high accuracy clock pulses is coupled to the meter 100 via the optical port 170. The processing circuit 115 then performs a test by which the received high accuracy pulses are compared to internally generated clock pulses to determine accuracy. In such an embodiment, the firmware switch 180 is not necessary.

As discussed above, the alternative set of operations of FIG. 4 require a source of high accuracy clock pulses. This source may simply replace the frequency counter unit 506 of FIG. 5B, or may be implemented within a meter programming unit 504 itself. Such high accuracy pulse devices would be known to those of ordinary skill in the art.

In step 405, the processing circuit 115 receives a command to measure clock accuracy. Such a command can be received via serial data communications through the optical port, or using a reed switch or some other known device that provides simple command inputs to a meter. After step 405, the processing circuit executes step 410.

In step 410, the processing circuit 115 connects the receive RX port 119b to an internal counter, not shown, referred to as the RX counter. In step 415, the processing circuit 115 connects the clock 116 to another internal counter, not shown, referred to as the clock counter. In step 420, the processing circuit 115 resets or otherwise synchronizes start times and values for the RX counter and the clock counter and allows the counters to accumulate pulses from the respective sources for a predetermined period of time.

Upon conclusion of the test, in step 425, the processing circuit 115 obtains and compares the counts from the RX counter and the clock counter. The difference between the obtained RX counter value and the obtained clock counter value is representative of the clock accuracy error. In step 425, the processing circuit 115 calculates such error and causes the error to be displayed, stored and/or communicate externally.

It will be appreciated that the test may be concluded in multiple alternative ways. For example, the test may conclude after a predetermined amount of time has passed (or predetermined number of internal or external clock cycles have been counted) since the synchronization/start of step 420. In some case, the processing circuit will continue to count pulses until the processing circuit 115 determines that clock pulses are no longer being received. For example, the processing circuit 115 can monitor the input TX pin 119a for a recognizable data string, signaling the end of the test. The test may conclude if another external input is received, for example, through a reed switch, or if external power is removed from the meter altogether.

In addition, in one alternative embodiment, the external source of pulses may simply provide a pulse every second, or every n seconds. In such a case, the processing circuit 115 in step 420 would use only the internal counter. The internal counter would would start accumulating internal clock pulses upon reception of one pulse on the RX pin 119b, and then stop accumulating internal clock pulses upon reception of the next pulse on the RX pin 119b. The processing circuit 115 would then determine error by comparing the count of the internal counter to an expected frequency value for the internal clock. For example, if the internal clock has a nominal frequency or 32,768 Hz, then the number of internal clock pulses accumulated on the internal counter between two consecutive one-second pulses received on the RX pin 119b should be 32,768. Any difference would represent error. The processing circuit 115 may suitably calculate this error as a percentage, display the detected frequency of the internal clock, or simply display the count.

Other methods of determining the coincidence, or conversely the error, between the internal clock and an external source of any frequency can be implemented.

It will be appreciated that the above-describe embodiments are merely exemplary, and that those of ordinary skill in the art may readily devise their own implementations and adaptations that incorporate the principles of the present invention and fall within the spirit and scope thereof.

I claim:

1. An arrangement for measuring a clock function within an electricity meter, comprising:
    an optical communication circuit disposed within the electricity meter, operably coupled to receive a pulse output of an internal meter clock, and generate a corresponding optical pulse representative of the pulse output;
    an optical detector configured to detect the pulse output via an optical port of the electricity meter;
    a frequency counter operably coupled to the optical detector to receive a signal that is representative of the detected pulse output, the frequency counter configured to generate a frequency value representative of a frequency of the detected pulse output based on the received signal.

2. The arrangement of claim 1, wherein the optical communication circuit and the internal meter clock are disposed within a meter housing.

3. The arrangement of claim 1, further comprising a display operably coupled to the frequency counter, the display configured to display the frequency value.

4. The arrangement of claim 1, wherein the optical communication circuit comprises a photo diode.

5. The arrangement of claim 1, further comprising:
a processing circuit disposed within the electricity meter, the processing circuit operably coupled to selectively provide the pulse output and a metrology circuit output to the optical communication circuit, said pulse output comprising a periodic signal having a predefined period.

6. The arrangement of claim 5, further comprising the metrology circuit, the metrology circuit configured to generate a measurement of electricity consumption, wherein the metrology circuit output is representative of the measurement of electricity consumption.

7. The arrangement of claim 6, wherein the metrology circuit output comprises an energy consumption measurement signal representative of energy delivered to a load.

8. The arrangement of claim 5, wherein the processing circuit includes an output pin coupled to the optical communication circuit, and wherein the processing circuit is configured to selectively provide the pulse output and a metrology circuit output to the output pin.

9. The arrangement of claim 8, further comprising the metrology circuit, the metrology circuit configured to generate a measurement of electricity consumption, wherein the metrology circuit output is representative of the measurement of electricity consumption.

10. The arrangement of claim 9, wherein the metrology circuit output comprises an energy consumption measurement signal representative of energy delivered to a load.

11. The arrangement of claim 10, further comprising a display operably coupled to the frequency counter, the display configured to display the frequency value.

12. The arrangement of claim 10, wherein the optical communication circuit comprises a photo diode.

* * * * *